United States Patent [19]

Nagashima

[11] 4,186,385
[45] Jan. 29, 1980

[54] ELECTRONIC APPARATUS PUSH BUTTON KEYBOARD ASSEMBLY

[75] Inventor: Shinichi Nagashima, Suwa, Japan

[73] Assignee: Kabushiki Kaisha Suwa Seikosha, Tokyo, Japan

[21] Appl. No.: 804,040

[22] Filed: Jun. 6, 1977

[30] Foreign Application Priority Data

Jun. 4, 1976 [JP] Japan .................................. 51-65322

[51] Int. Cl.² ............................................. 606F 3/02
[52] U.S. Cl. ................................. 340/365 S; 200/5 A
[58] Field of Search ............ 340/365 R, 365 S, 365 E, 340/166 R, 146.1 AB; 364/709; 200/5 A, 5 B, 1 R, 1 A; 235/145 R; 197/98, 100; 400/479; 179/90 K; 178/17 C

[56] References Cited

U.S. PATENT DOCUMENTS

| | | | |
|---|---|---|---|
| 3,715,746 | 2/1973 | Hatano et al. | 340/365 S |
| 3,717,871 | 2/1973 | Hatano et al. | 340/365 S |
| 3,721,976 | 3/1973 | Kuijsten | 340/365 S |
| 3,818,441 | 6/1974 | Nomiya et al. | 340/365 E |
| 4,064,399 | 12/1977 | Muranaka | 340/365 R |

FOREIGN PATENT DOCUMENTS 2517903  11/1975  Fed. Rep. of Germany .......... 200/5 A

*Primary Examiner*—John W. Caldwell, Sr.
*Assistant Examiner*—James J. Groody
*Attorney, Agent, or Firm*—Blum, Kaplan, Friedman, Silberman & Beran

[57] ABSTRACT

A simplified keyboard input assembly particularly suited for use with a miniaturized electronic calculator or combination electronic calculator-wristwatch is provided. The keyboard input assembly is particularly characterized by a plurality of manually operated switches formed in two groups and a plurality of logic gates corresponding to each of the manually operated switches, the logic gates being disposed in two groups. A first input of each of the logic gates in a first group of logic gates is coupled to the manually operated switches in a first group, and a first input of each of the logic gates in the second group of logic gates is coupled to the manually operated switches in the second group of manually operated switches. A second input of each of the logic gates in the first group of logic gates is coupled to a second input of a logic gate in the second group of logic gates and is further coupled to a manually operated switch in the first group of manually operated switches and a manually operated switch in the second group of manually operated switches so that the actuation of each of the manually operated switches will coincidentally energize the first and second inputs of one of said logic gates corresponding thereto and thereby produce a predetermined input signal.

4 Claims, 2 Drawing Figures

| | a | b | c | d | e | f | g | h | i | j |
|---|---|---|---|---|---|---|---|---|---|---|
| A | 7 | 8 | 9 | + | C | 4 | 5 | 6 | − | CE |
| B | 0 | . | = | ÷ | √ | 1 | 2 | 3 | + | % |

ELECTRONIC APPARATUS PUSH BUTTON KEYBOARD ASSEMBLY

BACKGROUND OF THE INVENTION

This invention is directed to a simplified keyboard input assembly and, in particular, to a keyboard input assembly having a reduced number of wiring connections for rendering same particularly suitable for use with electronic wristwatches, calculators and combination wristwatch-calculators.

Heretofore, keyboard input assemblies for use with electronic calculators, wristwatches and the like, have taken on various forms. The most popular form utilizes a keyboard comprised of a plurality of manually operated switches, each switch producing a predetermined input signal. As an alternative to such keyboards, electronic matrix systems, wherein digital signals are utilized to produce the predetermined input signals, have been provided. It is noted however that both keyboard input assemblies have been found to be less than completely satisfactory in view of the particular nature thereof. For example, when an independent switch or key is provided for each input, wiring is required for each input switch or key, thereby preventing the number of wires from being reduced to a number less than the number of keys or switches provided. In electronic matrix input systems, wherein digital signals are utilized to produce the predetermined input signals, although the wiring can be reduced, when digital displays such as those formed of liquid crystals and the like are utilized, the digital signals are not compatible with the display, thereby requiring the complex circuitry be utilized to render same compatible. Accordingly, an improved keyboard input assembly, wherein a manually operated switch is provided for each input, and wherein the number of wires coupled to the manually operated swtiches can be substantially reduced, is desired.

SUMMARY OF THE INVENTION

Generally speaking, in accordance with the instant invention, a simplified keyboard input assembly comprised of a plurality of manually operated switches is provided. Each of the manually operated switches is adapted to select a predetermined input and includes a first and second contact. The plurality of manually operated switches are equally divided into first and second groups. A plurality of logic gates are provided, each of the logic gates corresponding to one of the manually operated switches. Each logic gate includes a first input and a second input and is adapted to produce a predetermined input signal in response to the first and second inputs of the logic gate being coincidentally energized. The logic gates are equally divided into first and second groups. A first input of each of the logic gates, in the first group of logic gates, is coupled to the first contact of all of the plurality of manually operated switches in the first group, the first input of the logic gates in the second group of logic gates is coupled to a first contact of all of the manually operated switches in the second group of manually operated switches. At least one of the second inputs of each logic gate in the first group of logic gates is coupled to a second input of a logic gate in the second group of logic gates, and is further coupled to a second contact of at least one manually operated switch in the first group and a second contact of a manually operated switch in the second group of manually operated switches, so that a first and second input of one of the logic gates are coincidentally energized in response to a manually operated switch coupled thereto being actuated.

Accordingly, it is an object of the instant invention to provide a simplified keyboard input assembly.

A further object of the instant invention is to provide an improved keyboard input assembly wherein the number of connections between the manually operated switches, comprising the keyboard, is substantially reduced.

Still a further object of the instant invention is to provide an improved keyboard input assembly wherein a plurality of logic gates are utilized in combination with a plurality of manually operated switches comprising the keyboard in order to reduce the number of wire connections required produce predetermined input signal corresponding to each of the manually operated switches provided.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figures 1, 2:
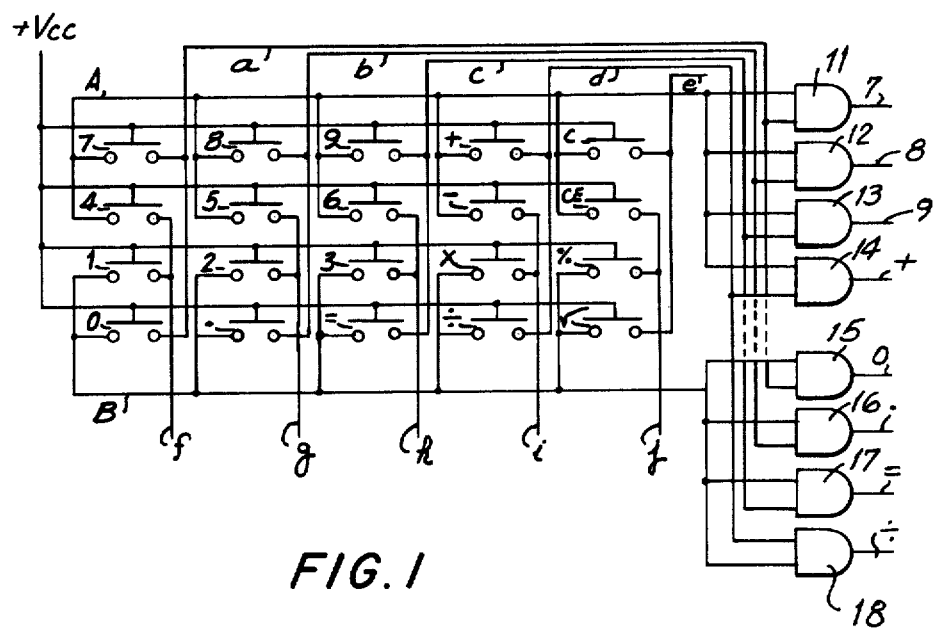
FIG. 1 is a schematic circuit diagram of a keyboard input assembly constructed in accordance with a preferred embodiment of the instant invention.
FIG. 2 is a table demonstrating the simplified wiring of the keyboard input assembly, depicted in FIG. 1.

Reference is now made to FIG. 1, wherein a keyboard input assembly for use with a miniaturized electronic calculator or combination wristwatch-calculator is depicted. The keyboard is comprised of twenty manually operated switches. Each manually operated switch is adapted to produce a predetermined input signal representative of numerical information or a function to be performed. It is noted that the specific predetermined inputs, illustrated in FIG. 1, are presented by way of example only. Moreover, the keyboard information, illustrated for the exemplary embodiment depicted in FIG. 1, is particularly suited for use in a calculator-electronic timepiece of the type described and claimed in U.S. patent application Ser. No. 522,085, now U.S. Pat. No. 4,041,295, which application is incorporated by reference as if fully set forth herein.

Accordingly, the twenty manually operated input switches or keys, depicted in FIG. 1, produce the ten numerical inputs from 0 to 9 and a decimal point, and the functional inputs of $=, \times, +, -, \sqrt{}, \%$, CE and C. The keyboard input assembly, in addition to the manually operated switches, is comprised of twenty AND gates, one AND gate for each switch or key. Eight of the twenty AND gates numbered 11 through 18 are illustrated in FIG. 1 for purposes of explanation of the instant invention. The particular manner in which the manually operated swtiches are coupled to the first group of ten AND gates through lead A and the second group of ten AND gates through lead B by leads a through j, is illustrated in the table depicted in FIG. 2.

Specifically, each of the twenty manually operated switches is provided with at least two contacts. In an exemplary embodiment, a common contact of each of the manually operated switches is coupled to a positive power supply $V_{cc}$ to apply a positive signal to both contacts of the manually operated switch and thereby energize an AND gate coupled to the contacts of the switches. It is noted however that the power supply can be coupled to each switch contact and is not limited to the common contact.

Specifically, half of the switches have a first contact coupled through wire A to a first input of a first group of ten AND gates, which group includes AND gates 11 through 14. The first contact of the remaining manually operated switches are coupled through lead B to the first input of the second group of ten AND gates, including AND gates 15 through 18. As is illustrated in FIG. 2, the manually operated switches, for producing a predetermined input signal representative of the numeral 7, 8, 9, +, C, 4, 5, 6, − and CE, are coupled through lead A, whereas the manually operated switches, for producing the predetermined input signal representative of 0, 1, =, +, $\sqrt{}$, 1, 2, 3, + and % are coupled through lead B. A second contact of each manually operated switch, having its first contact coupled to lead A, is coupled to a second contact of a manually operated switch having its first contact coupled to lead B, and is further coupled to a second input of one of the AND gates in the first group of AND gates and a second input of an AND gate in the second group of AND gates. For example, switch 7, which switch produces a predetermined input signal representative of the number 7 in response to being actuated, has its second contact coupled to the second contact of the manually operated swtich 0, which switch produces a predetermined input signal representative of the number 0. Moreover, the second contact of manually operated switch 7 and the manually operated switch 0 are coupled through lead a to the second input of the AND gate 11 and are further coupled through lead a to a second input of AND gate 15. Similarly, the second input of manually operated switch or key 8 is coupled in common with the second input of the manually operated switch for the decimal point (.), and the second contacts are coupled in common through wire lead b to the second inputs of AND gate 12 and AND gate 16.

By way of illustration of the operation of the instant invention, if manually operated switch 7 is a push botton switch, if switch 7 is pushed, lead A and lead a are energized, thereby energizing both inputs of AND gate 11 to thereby produce, at the output of the AND gate 11, a predetermined input signal representative of the number seven. Similarly, if switch 8 is pushed, lead A and lead b are coincidentally energized, thereby applying HIGH level inputs to the first and second inputs of AND gate 12 to thereby produce, at the output thereof, a predetermined input signal representative of the number 8. Accordingly, as each manually operated push button key is pushed, both inputs of an AND gate, associated therewith, are energized to thereby produce a predetermined input signal representative of the number of function of the key.

Accordingly, the instant invention is particularly characterized by the number of wire connections for each manually operated switch or key being reduced. For example, in the embodiment illustrated in FIG. 1, only twelve wires are required for the twenty manually operated switches capable of producing twenty distinct numerical or functional inputs. The keyboard input assembly, illustrated in FIG. 1, is particularly suitable for use with calculators, wristwatches and combination calculator-wristwatches. In small-sized wristwatches, having a calculator circuit therein, problems often occur in insulating the keys of the keyboard from the remaining circuit elements and from each other. In order to provide sufficient insulation, the cost is often considerably raised in manufacturing such wristwatches. However, by utilizing the keyboard input assembly of the instant invention, the entire keyboard can be formed in a unitary configuration offering a simpler and less expensive keyboard construction.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A keyboard input assembly comprising a plurality of manually operated push button switches divided into first and second groups, each of said switches having a first and second fixed contact and a movable member for contacting both said first and second contacts when said button switch is operated and for remaining out of contact with said first and second contacts when said switch is not operated, a plurality of logic means, each said logic means corresponding to one of said manually operated switches, and each said logic means having at least a first input means and a second input means and each said logic means being adapted to produce a predetermined signal in response to said first and second inputs of said logic means being coincidentally energized, said logic means being divided into first and second groups, a first input of each of said logic means in said first group being coupled to all of said plurality of said first fixed contacts in said first group of manually operated switches, each said first input of said logic means in said second group being coupled to all of said first fixed contacts in said second group of manually operated push button switches, a second input of each logic means in said first group of logic means being coupled to the second input of an individual logic means in said second group of logic means, and being further coupled to the second fixed contact of one manually operated push button switch in said first group and one manually operated push button switch in said second group of manually operated push button switches, so that each of said first and second inputs of said logic means are coincidentally energized by a fixed power supply in response to said manually operated push button switch corresponding thereto being actuated, the movable member of each of said push button switches being continuously coupled to said power supply.

2. A keyboard input assembly as claimed in claim 1, wherein each said logic means is a logic gate adapted to produce an output signal only when both of its inputs are coincidentally energized.

3. A keyboard input assembly as claimed in claim 2, wherein said logic gates are all AND gates.

4. A keyboard input assembly as claimed in claim 1, wherein said plurality of manually operated push button switches includes n manually operated switches, each of said first fixed contacts of said manually operated switches in said first group being connected through a first lead to said first inputs of said first group of logic means and said first fixed contacts in said second group of manually operated switches being connected through a further lead to the first inputs of said second group of logic means, a second fixed contact of each said manually operated push button switches in said first group being coupled to a second fixed contact of an individual one of said manually operated push button switches in said second group, each of said coupled second fixed contacts being connected through a lead to the second input of the corresponding logic means in said first group and second input of the corresponding logic means in said second group so that the number of leads equal $n/2+2$.

* * * * *